(12) United States Patent
Ivankin et al.

(10) Patent No.: US 10,459,004 B2
(45) Date of Patent: Oct. 29, 2019

(54) ELECTRICAL CONTACT AUTO-ALIGNMENT STRATEGY FOR HIGHLY PARALLEL PEN ARRAYS IN CANTILEVER FREE SCANNING PROBE LITHOGRAPHY

(71) Applicant: TERA-print, LLC, Evansville, IN (US)

(72) Inventors: Andrey Ivankin, Chicago, IL (US); Jared A. Magoline, Fond du Lac, WI (US)

(73) Assignee: Tera-Print, LLC

( * ) Notice: Subject to any disclaimer, the term of this patent is extended or adjusted under 35 U.S.C. 154(b) by 0 days.

(21) Appl. No.: 15/887,275

(22) Filed: Feb. 2, 2018

(65) Prior Publication Data

US 2018/0217183 A1  Aug. 2, 2018

Related U.S. Application Data

(60) Provisional application No. 62/453,757, filed on Feb. 2, 2017.

(51) Int. Cl.

| | | |
|---|---|---|
| *G01Q 80/00* | (2010.01) | |
| *G01Q 70/14* | (2010.01) | |
| *G01Q 10/04* | (2010.01) | |
| *G03F 7/00* | (2006.01) | |
| *G01Q 70/06* | (2010.01) | |

(52) U.S. Cl.
CPC .............. *G01Q 80/00* (2013.01); *G01Q 10/04* (2013.01); *G01Q 70/14* (2013.01); *G03F 7/0002* (2013.01); *G01Q 70/06* (2013.01)

(58) Field of Classification Search
CPC ........ G01Q 10/04; G01Q 10/14; G01Q 80/00; G01Q 70/06; B05D 1/18; B05D 1/26; G03F 7/0002; G03F 7/031; G03F 7/038; G03F 7/20; G03F 7/213; G03F 7/22
See application file for complete search history.

(56) References Cited

U.S. PATENT DOCUMENTS

| | | | | |
|---|---|---|---|---|
| 2002/0063212 A1* | 5/2002 | Mirkin | ............... | B82B 3/00 250/306 |
| 2009/0205091 A1* | 8/2009 | Haaheim | ............... | G03F 7/0002 850/33 |
| 2011/0165329 A1* | 7/2011 | Mirkin | ............... | G03F 7/0002 427/256 |
| 2014/0134336 A1* | 5/2014 | Ha | ............... | B05C 11/00 427/256 |
| 2015/0309073 A1* | 10/2015 | Mirkin | ............... | B82Y 40/00 850/55 |
| 2016/0252545 A1* | 9/2016 | Amponsah | ............... | G01Q 20/02 850/6 |

* cited by examiner

*Primary Examiner* — David E Smith
(74) *Attorney, Agent, or Firm* — Barnes & Thornburg LLP

(57) ABSTRACT

Disclosed embodiments provide an electrical contact alignment strategy for leveling an array of probes, pens, tips, etc., in relationship to a substrate, for example, wherein a plurality of independent electrical circuits are formed by configuring regions of the array and substrate regions to be partially conductive and connected to opposite electrodes or vice versa.

61 Claims, 8 Drawing Sheets

ELECTRICAL CONTACT AUTO-ALIGNMENT STRATEGY FOR HIGHLY PARALLEL PEN ARRAYS IN CANTILEVER FREE SCANNING PROBE LITHOGRAPHY

CROSS REFERENCE AND PRIORITY CLAIM

This patent application claims priority to U.S. Provisional Applications 62/453,757 filed Feb. 2, 2017, the disclosure of which being incorporated herein by reference in its entirety.

GOVERNMENTAL RIGHTS

This invention was made with government support under grant award 1621773 awarded by National Science Foundation. The government has certain rights in the invention.

COPYRIGHT AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

Disclosed embodiments provide utility in area of lithography (also known as nano-/micro-fabrication, nano-patterning or nano-printing) methodologies.

BACKGROUND

Recent groundbreaking advances in scanning probe lithography made by the Mirkin Group, headed by Dr. Chad A. Mirkin, at Northwestern University have addressed many technical limitations of conventional nano-patterning strategies using innovative methodologies for controlling molecular and material architecture at the nanoscale and microscale, i.e., between 1 nm-10 µm length.

In a technically significant departure from the conventionally used cantilever-based paradigm, Dr. Mirkin invented Cantilever-Free Scanning Probe Lithography (CF-SPL), a technique that relies on a new architecture in which the cantilever is replaced with an inexpensive elastomeric film containing up to millions of pyramidal tips on a rigid substrate and affording massive scaling while preserving high resolution.

As recognized by Dr. Mirkin, massively parallel tip arrays can be used for direct molecular printing—a technique known as Polymer Pen Lithography (PPL) or diffraction-unlimited patterning with light when combined with near- and far-field photolithography—a method known as Beam Pen Lithography (BPL).

To produce uniform feature sizes over large areas with either PPL or BPL, the probe array must be aligned parallel to the substrate. Conventionally, this procedure is performed manually, by optically inspecting each corner of a probe array and identifying the points-of-contact or automatically by measuring force resulting from a physical contact between a probe array and a substrate.

SUMMARY

Disclosed embodiments provide apparatuses and methodologies for lithography, nano-printing, and nano-patterning.

Disclosed embodiments provide an electrical contact alignment strategy for leveling a probe array in relationship to a substrate.

In accordance with at least one disclosed embodiment, a plurality of independent electrical circuits are formed by configuring probe array regions and the substrate regions to be partially conductive and connected to opposite electrodes (or the opposite electrodes are connected to different, electrically isolated regions of the array).

In accordance with at least one disclosed embodiment, application of a voltage bias is used to induce a measurable electrical current evidencing contact between a region of the substrate and a corresponding region of the array.

In accordance with at least one disclosed embodiment, iterative control and movement of the array relative to the substrate, or vice versa, while measuring current between corresponding conductive regions thereof (indicative of electrical contact), enables leveling of the array and the substrate relative to each other.

DETAILED DESCRIPTION

Figure 1:
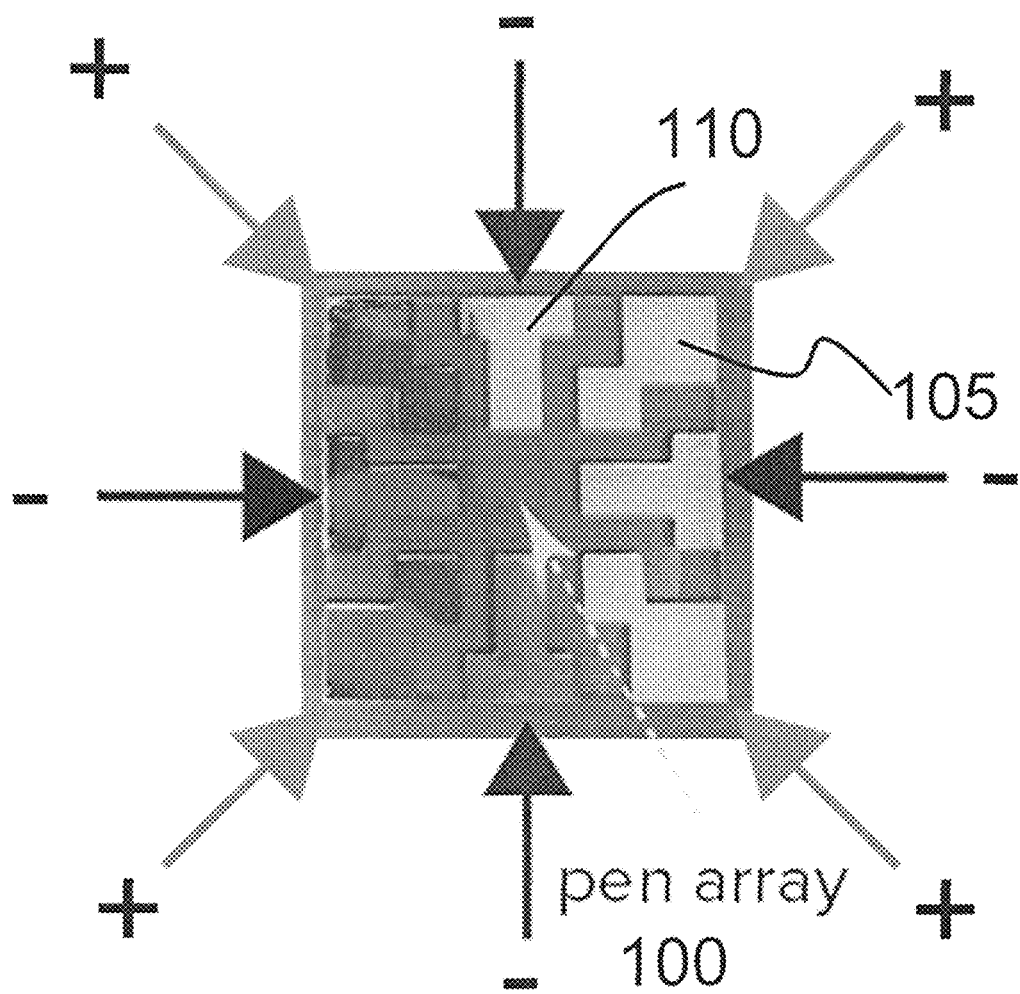
FIG. 1 provides an example of modifications made to a probe array in accordance with at least one of the disclosed embodiments.

For the purposes of this disclosure, reference is made to various types of arrays, generally referred to herein as "probe arrays," i.e., an array of probes used for nano-patterning, nano-printing, lithography and other types of manufacturing of components, devices, materials, etc. Thus, one of ordinary skill in the art should appreciate that the term "probe array" refers to any type of array of pens, probes, tips, etc., utilized for dispensing, removing, or imprinting material or substrate as well as for delivering electrical current, magnetic fields, light, heat, or other forms of energy.

With this understanding in mind, disclosed embodiments provide apparatuses and methodologies for printing, lithography, nano-fabrication, nano-printing, and nano-patterning.

In such technologies, conventional mechanisms for aligning a pen array parallel to a substrate require manual alignment, for example, by optically inspecting each corner of a probe array and identifying the points-of-contact. Such conventional methods have various flaws: (i) the process being tedious, often requiring more time than the actual patterning itself; (ii) the points-of-contact being ambiguously identified by a scientist, resulting in misalignment and poor, defective or flawed patterned materials; (iii) out-ofplane optical resolution is limited to ~500 nm, thereby further contributing to alignment inaccuracy; and (iv) the tips must be optically transparent, which is especially problematic in the case of the gold film-coated BPL array tips.

Another conventional alignment strategy that has been recently developed is based on force feedback paradigms. Given the elastomeric nature of a polymer pen array, the approach relies on maximizing the compression force of the array for a predefined compression distance. Although this strategy enables some degree of automation of an array leveling routine, it lacks reliability and generality.

The compression can originate both from the polymeric pens and from the elastomeric layer between the polymeric pens and a rigid glass support. However, robust control over the uniformity and thickness of the latter is difficult to achieve during fabrication. In addition, deposition of a thin layer of a hard material on the polymeric pens (e.g. gold, aluminum, silicon oxide, silicon nitride), required for BPL applications and higher resolution PPL nano-patterning, is incompatible with a force feedback alignment strategy.

Presently disclosed embodiments, therefore, are the result of development of a streamlined approach to alignment that enables automated implementation as well as a more reliable alignment procedure. Accordingly, such embodiments have particular utility for implementation of both PPL and BPL manufacturing and commercialization of both PPL and BPL instruments.

Disclosed embodiments of the electrical contact alignment strategy are based on the innovative technical recognition that the tip array and the substrate can form an electrical circuit. This may be implemented, for example, by configuring the tips and the substrate to be partially conductive and connected to opposite electrodes (or the opposite electrodes are connected to different, electrically isolated regions of the probe array), and a resistance is added to the circuit. With such a configuration in place, application of a voltage bias will result in a measurable electrical current evidencing that the tips are touching (i.e., in contact with) the substrate, with no current being measurable when the tips and the substrate are not in contact.

FIG. 1 provides an example of modifications made to a probe array 100 in accordance with at least one of the disclosed embodiments. With reference to FIG. 1-6, a probe array 100, for example, a polymer pen array, can be mounted to a holder 115 while applying voltage bias and ground thereto. Accordingly, a probe array 100 may be positioned within the array holder 115, thereafter auto-alignment procedure is begun. As shown in FIG. 1, this is performed under the control of a software and hardware implemented controller (discussed herein with reference to FIGS. 6-8) by application of voltage to, for example, four corner regions 105 and connection of four center-side regions 110 to ground (or vice versa). Application of these voltage levels enables configuration of four independent electrical circuits, as a result of the eight regions created.

More specifically, as shown in FIG. 1, in order to implement the electrically-based alignment paradigm, various configurations of array material may be provided to implement nano-patterning and other types of lithographic operations. For example, one such configuration may be implemented by providing a thin layer (e.g., 5 nm-5 μm) of conductive material (e.g., Gold (Au), Aluminum (Al), Silver (Ag), Platinum (Pt), Titanium (Ti) or Chromium (Cr)) deposited to form electrical contacts 105 at corners of the probe array 100 along with a corresponding number of electrical contacts 110 in the center-side regions of the probe array, as illustrated in FIG. 1.

In the example illustrated in FIG. 1, the number of deposited corner contacts 105 is four; likewise, the number of side electrical contacts 110 is four. However, more or less numbers of contacts may be used without departing from the utility and scope of the disclosed embodiments.

Further, a shape of the probe array need not be square or orthogonal; rather, any shape is possible. Additionally, no specific shape of the electrical contacts 105, 110 is required. Moreover, the deposition of the material on the probe array need not be exactly on corners of the probe array. Rather, all that is required is that the deposited materials are electrically isolated from functional parts of the array 100 and other electrical contact areas 105, 110.

FIGS. 2-5 provide an example of a custom designed array holder for electrical contact auto-alignment in accordance with at least one disclosed embodiment. FIGS. 2-5 illustrate an example of a configuration of the array holder 115 wherein the holder 115 includes two components: a lower component 125 (illustrated in FIGS. 2-3) and an upper component 130 (illustrated in FIGS. 4-5).

Figure 2:
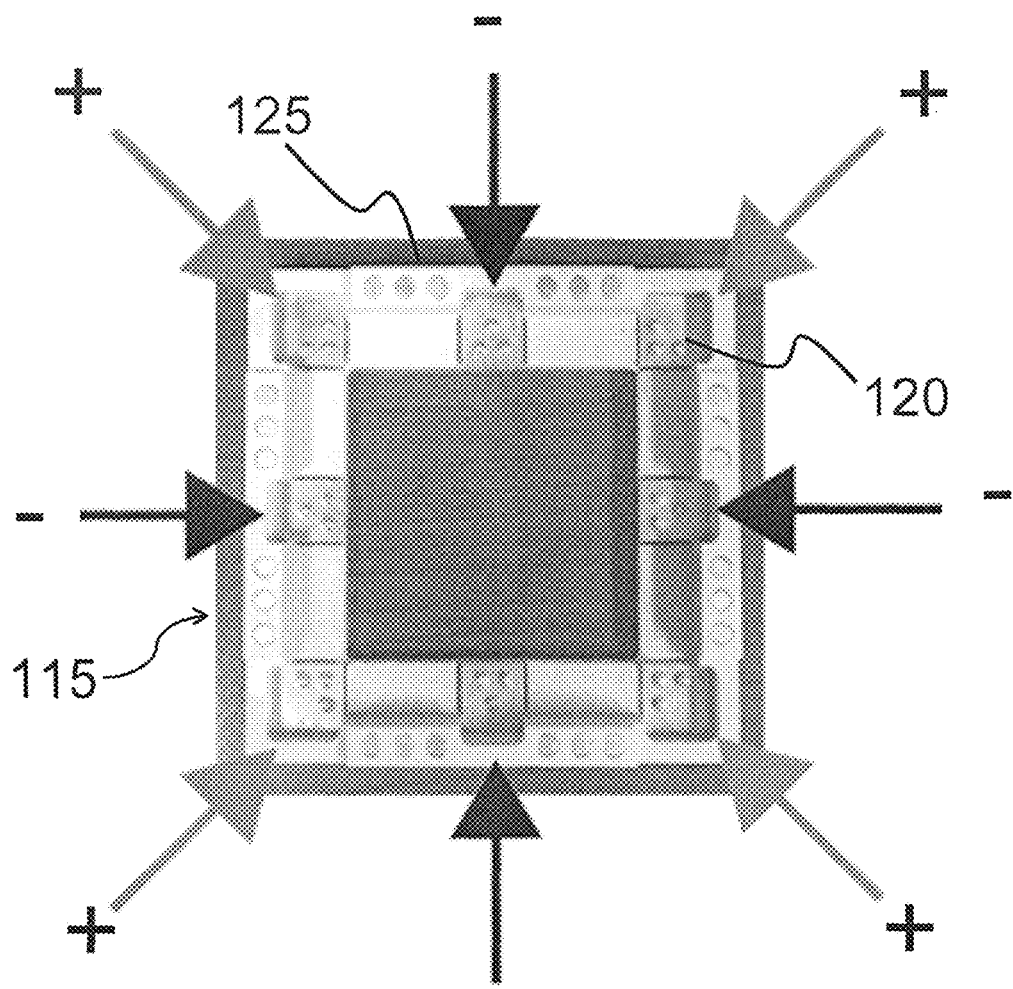
FIGS. 2 and 3 provide an example of a custom designed array holder for electrical contact auto-alignment in accordance with at least one disclosed embodiment.
Figure 3:
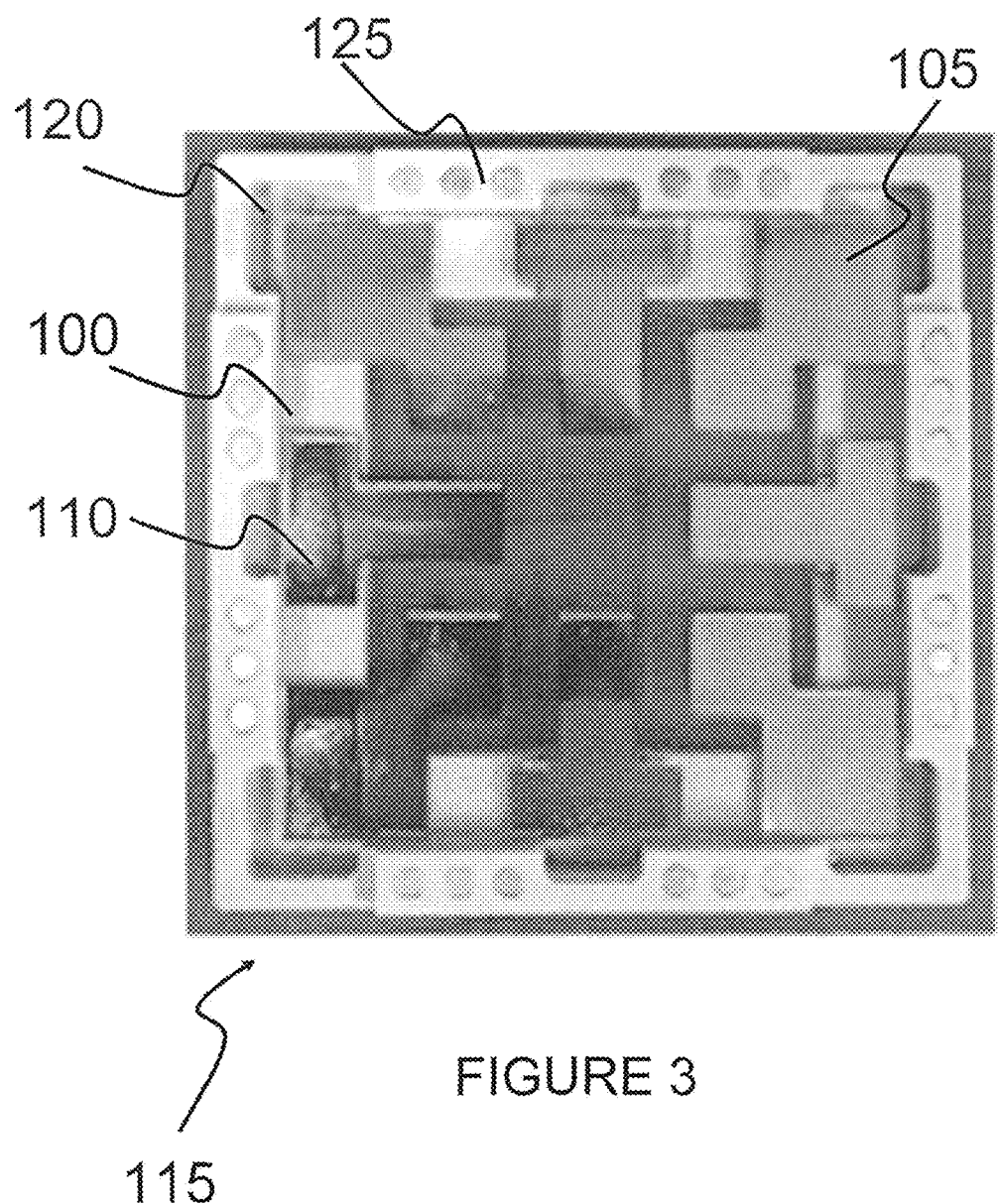

As shown in FIGS. 2-3, the lower component 125 provides support for the probe array 100. Lower component 125 includes a plurality of electrodes 120 corresponding to the electrical contact areas 105, 110 provided on the array 100.

Following loading of the array into the holder lower component 125, the conductive regions on the array 100 face the corresponding electrodes 120 on the lower component 125. The electrodes 120 on the holder lower component 125 can be introduced by incorporating conductive material pads, e.g., copper pads with spring-loaded pins, to compensate for potential imperfections in the flatness of the probe array. As noted above, there is no specific requirement for a particular number or positioning of conductive regions 105, 110 on the array 100; however, the positioning and number of those regions 105, 110 should correspond to the positioning and number of electrodes 120 on the holder lower component 125.

Figure 4:
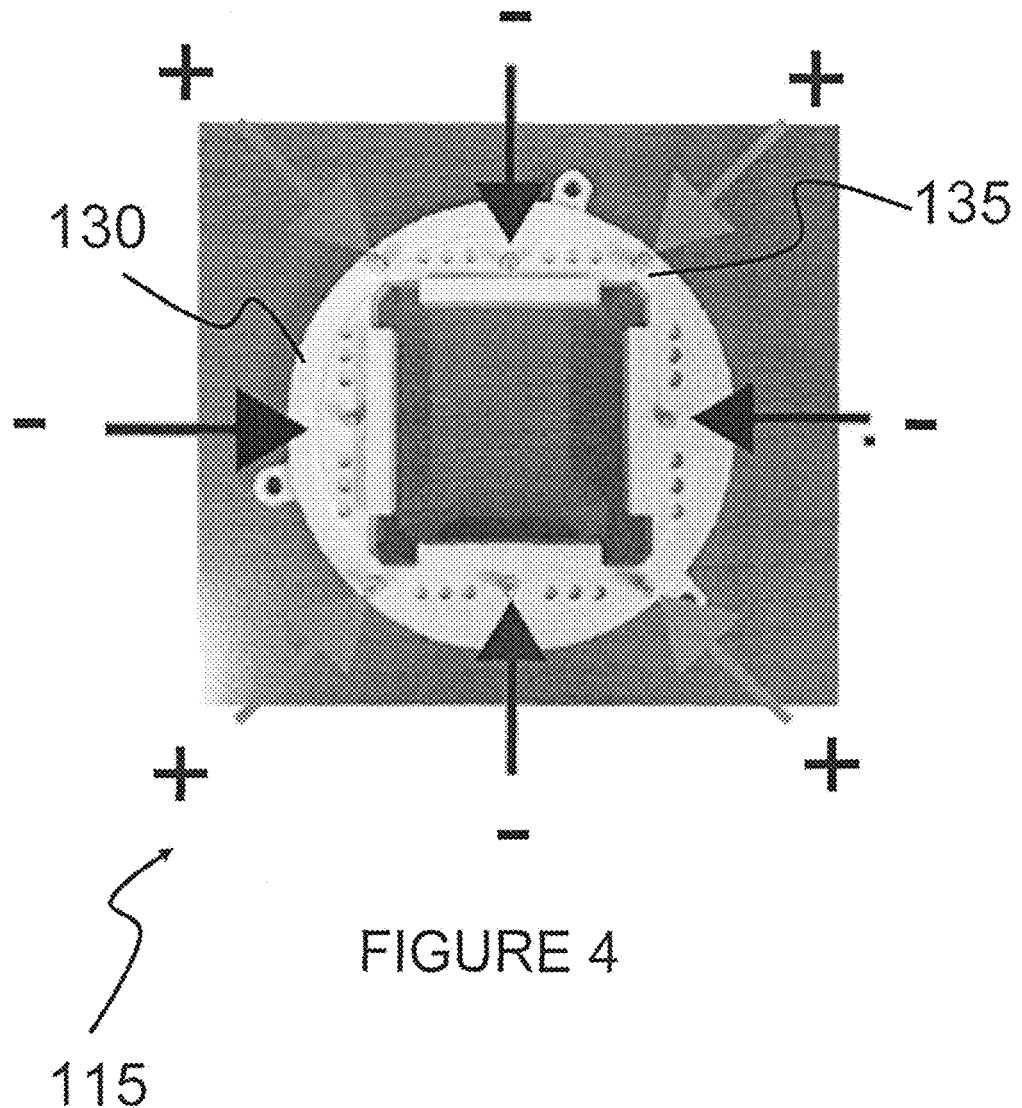
FIGS. 4 and 5 provide an illustration of an example interaction between an upper and lower portion of a custom holder for a probe array in accordance with at least one disclosed embodiment.
Figure 5:
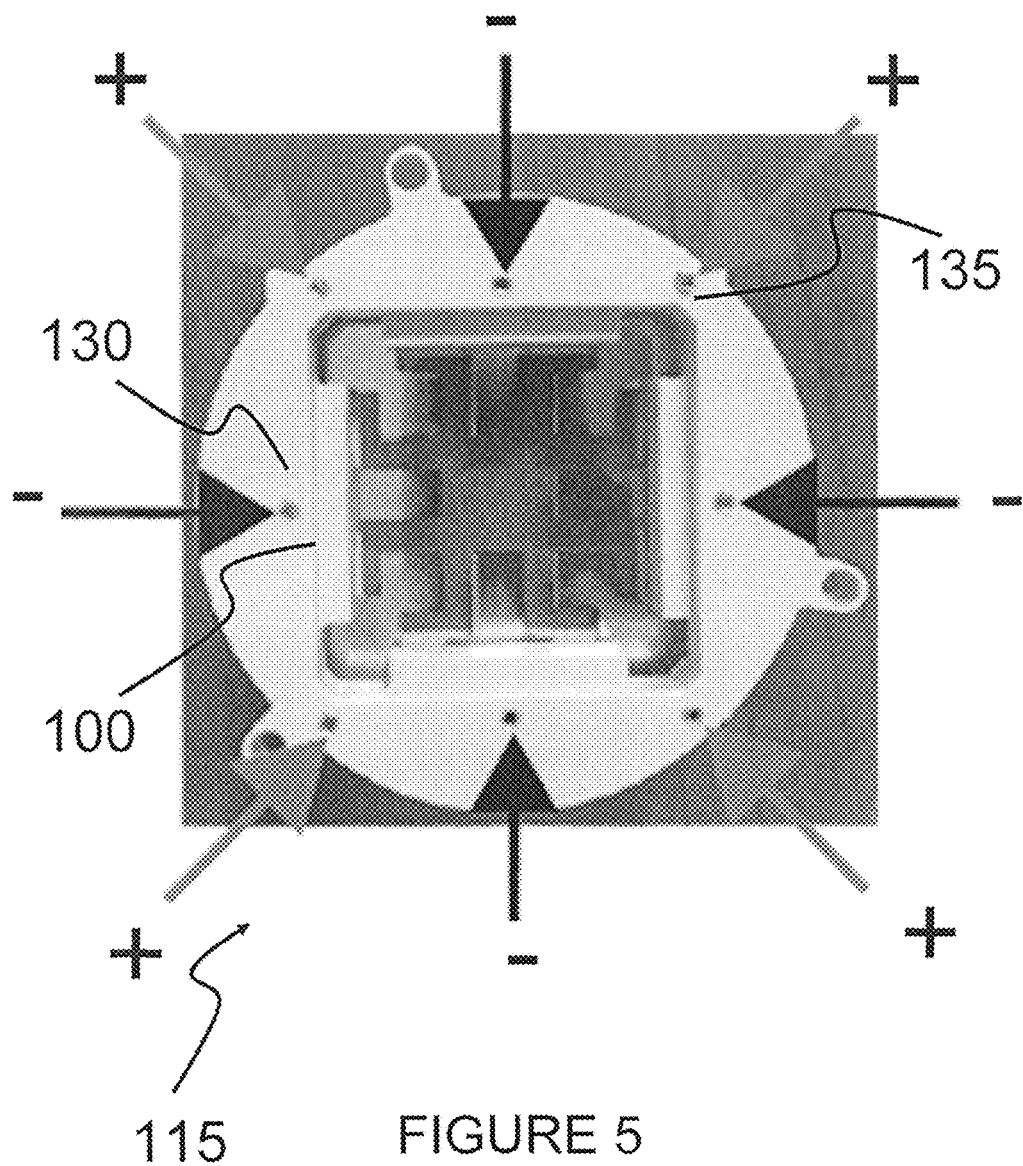

FIGS. 4-5 illustrate the upper comment 130 of the array holder 115. As shown in FIG. 4, the upper component 130 includes the same number of electrodes 135 aligned with corresponding electrodes 120 on the lower component 125. In this example of the disclosed embodiments, the lower component 125 is coupled to, or attached, to the upper component 130. The upper component, is, in turn, coupled, attached, or mounted to the tilting stage (explained further herein with reference to FIG. 8). In accordance with at least one disclosed embodiment, the electrodes 135 in the upper component 130 can be wired to the voltage bias and ground. Such a configuration enables the electrical signals to propagate completely to corresponding corners of the array 100 and also enables quick and efficient exchange of probe arrays 100.

Figure 6:
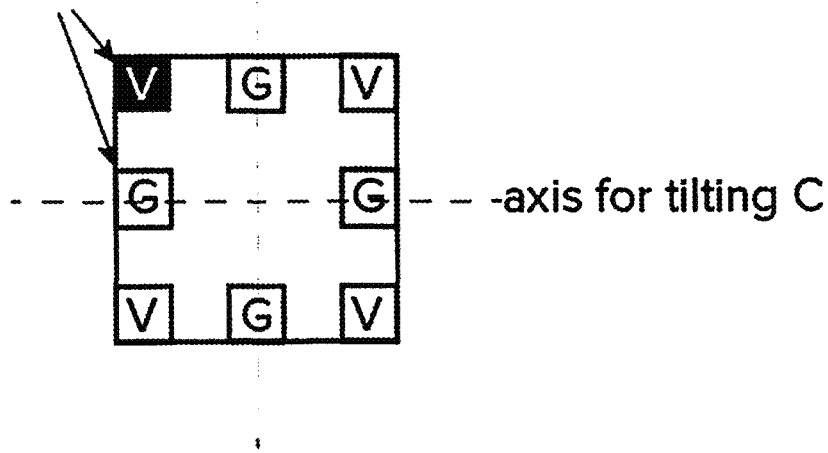
FIG. 6 illustrates the theory of operation of an electrical contact auto-alignment mechanism and methodology provided in accordance with at least one disclosed embodiment.

FIG. 6 illustrates the theory of operation of an electrical contact auto-alignment mechanism and methodology provided in accordance with at least one disclosed embodiment. FIG. 6 illustrates the auto-alignment procedure for a single axis (e.g., A). As part of that alignment procedure, an array may be provided and positioned on the disclosed array holder so as to be in contact with a substrate using a motorized translation stage (as discussed further herein with reference to FIG. 8). That contact corresponds to "shorting," or electrical contact anywhere from one to four circuits/corners. In this example, one shorted circuit indicates non-alignment, while two or more shorted circuits indicate complete alignment. Following a determination that there is not complete alignment, the array may be moved out of contact with the substrate and the array may be tilted along the axis of alignment to improve alignment.

For example, for axis A, tilting towards the right side may be performed, where no corner is touching. In this particular example, tilting may be performed using highly precise actuators at a resolution of $4 \times 10^{-5}$° (0.7 micro radians) with the minimum step of $\pm 4 \times 10^{-5}$° and the maximum step of $\pm 3.5$°.

For performing this example of the single axis alignment, the operations of determining the number of shorts and adjusting the tilt of the array may be performed iteratively until one of the corners on the opposite side or the array is shorted, thereby indicating electrical contact. In a multi-dimensional (e.g., two) alignment procedure, one the first axis is aligned, the adjustment operations may be performed for the other axis, e.g., axis C illustrated in FIG. 6. Thus, in operation, the disclosed leveling methodology may begin with fixing one of the planes and tilting the array in the other plane until it's leveled with the substrate.

In accordance with at least one embodiment, the auto-alignment procedure can begin with coarse tilting operations at a beginning part of an alignment procedure, to quickly reach a semi-aligned position. For example, an initial alignment can be performed with a relatively large tilt increment of 0.05° to quickly and effectively attain a quasi-leveled state. Subsequently, the two-step leveling operations may be repeated with a smaller increment, e.g., 0.001°. In such an embodiment, once semi-aligned position has been reached, the adjustment of positioning by the operations may be performed with the smaller tilting operations.

Criteria for being leveled may be the shorting of the electrical circuits on the opposite sides of the probe array for the electrical contact approach. Subsequently, the aligned plane may be fixed and the same procedure may be performed for the yet-to-be-aligned plane.

Figure 7:
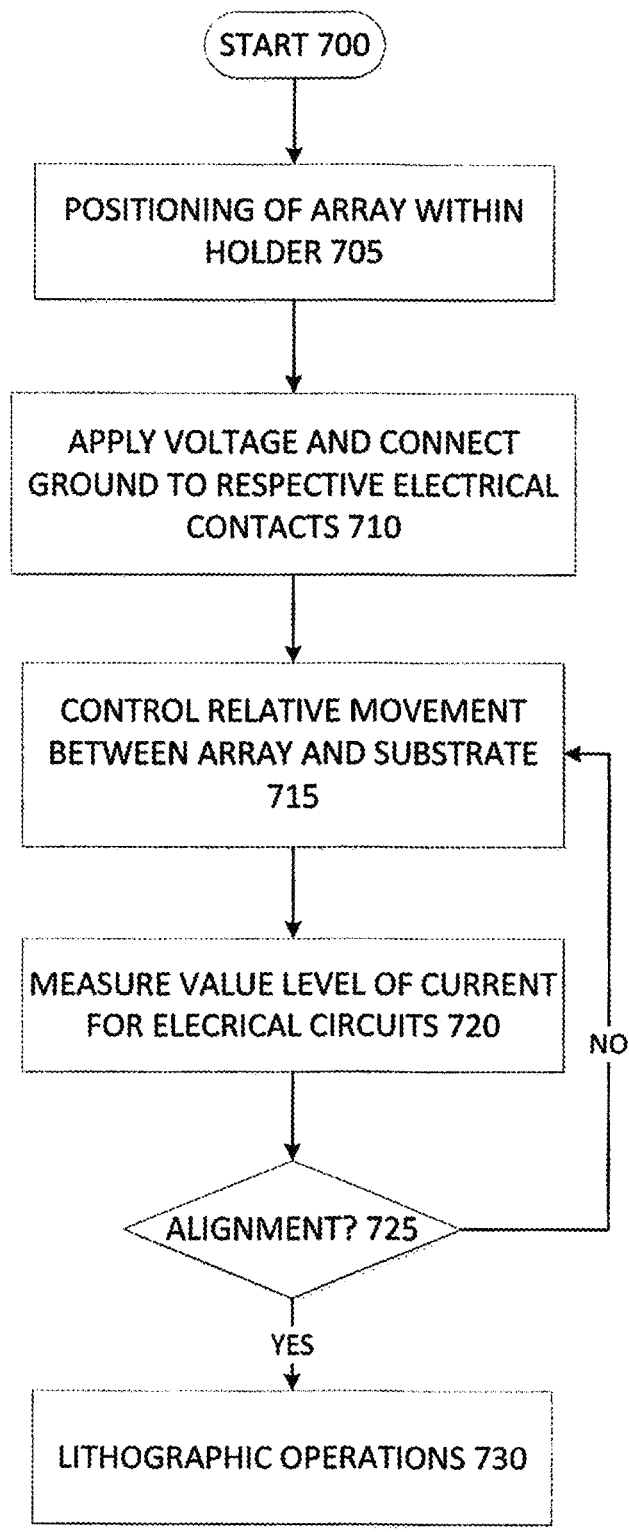
FIG. 7 illustrates a series of operations included in a methodology for auto-aligning a pen array provided in accordance with at least one disclosed embodiment.

FIG. 7 illustrates a series of operations included in a methodology for auto-aligning a probe array provided in accordance with at least one disclosed embodiment. As shown in FIG. 7, a lithographic manufacturing operation begins at 700, and a probe array is positioned within an array holder as disclosed herein at 705. Once the probe array is positioned in the holder, and a substrate is positioned relative to that probe array (by conventionally known mechanisms), the auto-alignment procedure is begun by application of voltage to the four corner regions and connecting the four center-side regions to ground (or vice versa) at 710. Application of these voltage levels enables configuration of four independent electrical circuits.

Thus, it should be understood that, in accordance with at least one embodiment, the auto-alignment methodology may be performed automatically in response to one or more sensors detecting that a probe array has been loaded into the holder. Alternatively, the auto-alignment methodology may be performed in response to the controller initiating the methodology based on external data, e.g., user initiated, initiation in response to other manufacturing components' instructions or control, etc. Disclosed embodiments enable alignment in an automated manner without the need for monitoring and input by a user as part of the alignment process.

Control then proceeds to 715, at which relative positioning of the array and the substrate is controlled iteratively by, for example, moving the array and/or substrate relative to one another by specified increments, e.g., increments between and including 0.05°-0.001°, and measuring for the presence and value level of current in each of the four circuits at 720. For example, by detecting current flowing at all four circuits enables reliable identification of the point of contacts of the tips at the four corners and the substrate in an uncoupled, or independent, manner. Thus, operations 715, 720 may be performed repeatedly until a determination is made at 725, that current is detected at two or more circuits. Once that determination is made, control proceeds to 730, at which alignment ends and lithographic operations begin. As one of ordinary skill in the art would understand, the operations 715, 720 may be performed in a manner consistent with FIG. 6 and the associated description.

The attached Appendix is an example of software code that enables automation of the leveling process, thereby eliminating an otherwise tedious procedure. That Appendix includes one example of such software including such a control routine written in LabVIEW™, which may be run on a general or special purpose computer to provide a controller for performing the controlled operations provided herein. However, it should be understood that the software code included in the Appendix is merely an example of one implementation and is not limiting to the scope of the disclosed embodiments.

Figure 8:
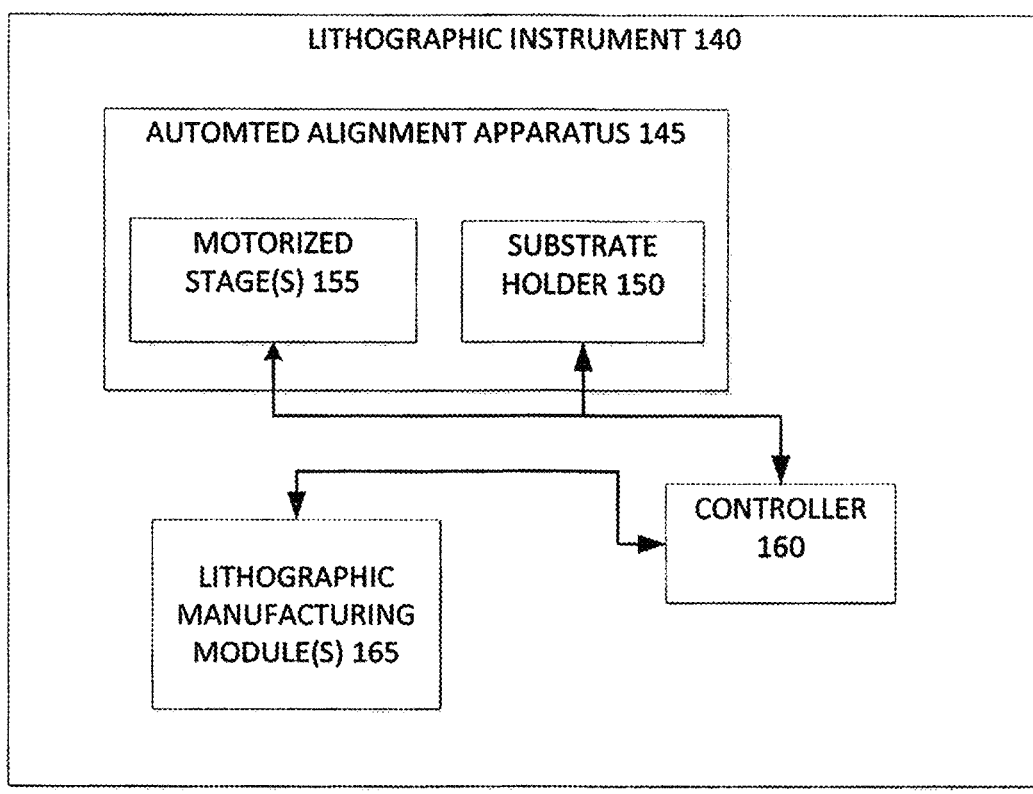
FIG. 8 illustrates a functional diagram illustrating a lithography instrument including the auto-alignment mechanism provided in accordance with the disclosed embodiment.

Following the determination that current is detected at two or more circuits at 725, subsequent nano-patterning, nano-printing or other lithographic operations may be performed FIG. 8 illustrates a functional diagram illustrating a lithography instrument 140 including the auto-alignment mechanism provided in accordance with the disclosed embodiment. Note, FIG. 8 illustrates the operation and cooperation of components of such a lithography instrument 140, in particular with reference to the novel and innovative array alignment mechanism disclosed herein. Accordingly, a detailed description of conventionally available and understood lithography, nano-fabrication, nano-printing and nano-patterning technology is not provided herein because it is within the level of skill of one of ordinary skill in the art.

Thus, generally speaking, the lithographic instrument 140 illustrated in FIG. 8, may include an automated alignment apparatus 145 and a substrate holder 150 (in the implementation where the array is moved and the substrate is held stationary apparatus includes a substrate table to hold the substrate). It should be noted that the automated alignment methodology disclosed herein can be performed by the substrate being moved relative to a stationary array 100; thus, a configuration of such an embodiment is within the scope of the disclosed embodiments as well.

The alignment apparatus 145 may include, at least one and, optionally, more than one motorized translation stage 155, e.g., a tip/tilt stage, upon which an array holder 115 is mounted and a controller 160. Thus, the array holder 115 may be mounted in the motorized tip/tilt stage 155 that may enable tilting of the array 100 in two orthogonal planes with a minimum increment possible (e.g., $4 \times 10^{-5}$° described here). The substrate holder 150 and the automated alignment apparatus 145 may be positioned under control of the controller 160. That controller 160 may be part of the apparatus 145 or coupled to the apparatus 145. Further, the controller 160 may include software, including the software included in the attached Appendix, and be implemented using one or more general or specific purpose computers, including memory. The controller 160 may also, optionally, control operation of one or more lithographic manufacturing modules 165 for performing, lithography, nano-fabrication, nano-patterning and/or nano-printing. Such lithographic manufacturing technology is within the skill level of one of ordinary skill in the art. Such lithographic manufacturing technology presently known and later developed techniques for direct molecular printing, e.g., PPL, or BPL, for example.

Those skilled in the art will recognize, upon consideration of the above teachings, that the above exemplary embodiments may perform the above-specified operations (and those referred in the claims) under the control of one or more controllers, e.g., controller 160, that may utilize or be based upon use of one or more programmed processors programmed with a suitable computer program, such as that disclosed in the Appendix or similar functionality. However, the disclosed embodiments could utilize one or more controllers implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments. It should be understood that the operations explained herein may be implemented in conjunction with, or under the control of, one or more general purpose computers running software algorithms to provide the presently disclosed functionality and turning those computers into specific purpose computers.

It should be understood that control and cooperation of components of the lithographic instrument designed in accordance with the disclosed embodiments may be provided using software instructions that may be stored in a tangible, non-transitory storage device such as a non-transitory computer readable storage device storing instructions which, when executed on one or more programmed processors, carry out the above-described method operations and resulting functionality. In this case, the term "non-transitory" is intended to preclude transmitted signals and propagating waves, but not storage devices that are erasable or dependent upon power sources to retain information.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments of the present invention. Such alternative storage devices should be considered equivalents.

Accordingly, control of the components illustrated in FIG. 8 and associated movement may be provided by software controlled actuators included in the stage 155, enable both movement of equipment and monitoring of electrical currents to determine contact/non-contact of regions of the array and substrate. Advantageously, such software may enable automation of the leveling process, thereby eliminating an otherwise tedious procedure. The Appendix provided herewith includes one example of such. However, it should be understood that the software code included in the Appendix is merely an example of one implementation as is not limiting to the scope of the disclosed embodiments.

Note, particular technical utility is provided by the disclosed components, apparatus and methodologies because, in accordance with at least one disclosed embodiment, only one analog output is required to apply a voltage bias and four analog inputs to read the current. Moreover, due to the low impedance of the system, only a small, less than 10 V, voltage is required to generate a measurable current. Such an implementation enables the use of a low-cost DAQ device for implementation.

As evidence of the technical utility of the presently disclosed embodiments, in accordance with at least one disclosed embodiment, an auto-alignment procedure may be based on electrical contact feedback that enables leveling of an elastomeric probe array with a substrate to 0.005° in less than 10 minutes on average in a repeatable and reliable manner. Moreover, the utility of this approach is not strictly limited to pristine elastomeric pen arrays, but also applicable to polymer pen arrays with a layer of hard material as well as to pen arrays made exclusively of a hard material.

As further evidence of the technical utility of the presently disclosed embodiments, it should be understood that conventionally known optical alignment techniques cannot achieve a leveling accuracy better than 0.02°. Additionally, it should be appreciated that the presently disclosed electrical contact leveling strategy provides a cost-effective and faster alternative to conventional approaches. Further, the presently disclosed electrical contact leveling strategy eliminates the conventional need for tip deformation as used in the force alignment method. Likewise, the presently disclosed embodiments can be used for leveling even when tips of an array are coated with hard materials (e.g., Au or Al in BPL experiments), which can cause complications to leveling using conventional force alignment approaches.

While certain illustrative embodiments have been described, it is evident that many alternatives, modifications, permutations and variations will become apparent to those skilled in the art in light of the foregoing description. While illustrated embodiments have been outlined above, it is evident that many alternatives, modifications and variations will be apparent to those skilled in the art.

For example, although disclosed embodiments have been described in relation to fabricating contacts on a probe array and applying voltage bias and ground to the probe array, wherein the substrate serves a passive role with the array being moved relative to the substrate, movement of the array and substrate can be reversed, e.g., the substrate may be moved in relation to a stationary array. Thus, the same principle is applicable when the contacts are created on the substrate and the voltage and ground are applied to the substrate, whereas the probe array plays a passive role, simply shortening electrically opposite regions.

Further, the voltage and ground positioning denoted by +,– symbols in the figures, may be switched with the same effect occurring to enable measurement of current flowing as a result of application of a voltage to regions in contact with one another.

Accordingly, the various embodiments of the invention, as set forth above, are intended to be illustrative, not limiting. Various changes may be made without departing from the spirit and scope of the invention.

As a result, it will be apparent for those skilled in the art that the illustrative embodiments described are only examples and that various modifications can be made within the scope of the invention as defined in the appended claims.

The invention claimed is:

1. A lithography instrument comprising:
a probe array;

a controller that controls positioning of the probe array or a substrate relative to each other, wherein a plurality of components are to be manufactured on the substrate by lithography; and means to align the probe array or the substrate parallel to each other on an automated basis for subsequent manufacturing lithography based on measured electrical current, wherein alignment of the probe array or the substrate to be parallel to each other is performed in multiple orthogonal planes to level the probe array or substrate relative to one another, wherein a layer of conductive material is deposited at at least two regions of the probe array and at least one region of the substrate, or vice versa, to form conductive regions, wherein application of voltage to the conductive regions on the probe array, substrate or both configures multiple independent electrical circuits between the probe array and the substrate, and wherein measurement of electrical current in each of the independent electrical circuits is indicative of relative positioning of the probe array and the substrate.

2. The lithography instrument of claim 1, further comprising a motorized tip/tilt stage coupled to the controller and either the probe array or the substrate that enables tilting of the probe array or the substrate in two orthogonal planes under the control of the controller.

3. The lithography instrument of claim 1, wherein the automated alignment applies a voltage bias to either or both of the probe array and the substrate to induce the measurable electrical current to indicate electrical contact between a conductive region of the substrate and a corresponding conductive region of the probe array.

4. The lithography instrument of claim 1, wherein the automated alignment forms an electric circuit capable of carrying electric current.

5. The lithography instrument of claim 1, wherein the automated alignment is performed by the controller performing iterative control and movement of either the probe array or the substrate relative to each other while measuring electrical current between corresponding conductive regions of the probe array and the substrate.

6. The lithography instrument of claim 1, wherein the automated alignment positions the probe array or the substrate such that the probe array and the substrate are positioned parallel to each other within 0.005° in less than ten minutes.

7. The lithography instrument of claim 1, wherein the probe array is one of a cantilever-free scanning probe array, a polymer pen/probe array or a beam pen/probe array.

8. The lithography instrument of claim 1, wherein the lithography instrument is a Polymer Pen Lithography instrument, and wherein the probe array includes a massively parallel array of probes, each of which acting as a point source for direct molecular printing.

9. The lithography instrument of claim 1, wherein the lithography instrument is a Beam Pen Lithography instrument, and wherein the probe array includes a massively parallel array of probes used to perform diffraction-unlimited patterning with light.

10. The lithography instrument of claim 9, wherein tips in the probe array are coated with an opaque material with apertures at apexes of the tips.

11. The lithography instrument of claim 1, wherein the lithography is cantilever-free scanning probe lithography.

12. The lithography instrument of claim 1, wherein features produced on the substrate via the lithography are nanoscale between 1 nm-10 μm in a least one dimension.

13. The lithography instrument of claim 1, wherein the layer of conductive material is deposited at at least two corners of the probe array or the substrate along with four regions in the center-side regions.

14. The lithography instrument of claim 13, wherein the layer of conductive material is between 5 nm and 5 μm.

15. The lithography instrument of claim 13, wherein the conductive material includes one of Au, Al, Ag, Pt, Ti, or Cr.

16. The lithography instrument of claim 13, wherein application of voltage to the four corner regions and connecting the four center-side regions to ground, or vice versa, configures four independent electric circuits, and wherein measurement of electrical current in each of the four electric circuits is indicative of relative positioning of the probe array and the substrate.

17. An electrical contact auto-alignment method for lithography, the method comprising:
providing a probe array;
positioning the probe array or a substrate relative to each another, wherein a plurality of components are to be manufactured on the substrate by lithography; and
aligning the probe array or the substrate parallel to each other on an automated basis for subsequent manufacturing lithography based on measured electrical current,
wherein alignment of the probe array or the substrate to be parallel to each other is performed in multiple orthogonal planes to level the probe array or substrate relative to one another,
wherein a layer of conductive material is deposited at at least two regions of the probe array and at least one region of the substrate, or vice versa, to form conductive regions,
wherein application of voltage to the conductive regions on the probe array, substrate or both configures multiple independent electrical circuits between the probe array and the substrate, and
wherein measurement of electrical current in each of the independent electrical circuits is indicative of relative positioning of the probe array and the substrate.

18. The method of claim 17, wherein the automated alignment applies a voltage bias to either or both of the probe array and the substrate to induce the measurable electrical current to indicate electrical contact between a conductive region of the substrate and a corresponding conductive region of the probe array.

19. The method of claim 17, wherein the automated alignment forms an electric circuit capable of carrying electric current.

20. The method of claim 17, wherein the automated alignment performs iterative control and movement of either the probe array or the substrate relative to each other while measuring electrical current between corresponding conductive regions of the probe array and the substrate.

21. The method of claim 17, wherein the automated alignment positions the probe array or the substrate such that the probe array and the substrate are positioned parallel to each other to 0.005° in less than ten minutes.

22. The method of claim 17, wherein the probe array is a cantilever-free scanning probe array, a polymer pen/probe array or a beam pen/probe array.

23. The method of claim 17, wherein the lithography is Polymer Pen Lithography, wherein the probe array includes a massively parallel array of probes, each of which acting as a point source for direct molecular printing.

24. The method of claim 17, wherein the lithography is Beam Pen Lithography (BPL), wherein the probe array includes a massively parallel array of probes used to perform diffraction-unlimited patterning with light.

25. The method of claim 24, wherein tips in the probe array are coated with an opaque material with apertures at apexes of the tips.

26. The method of claim 17, wherein the lithography is cantilever free scanning probe lithography.

27. The method of claim 17, wherein features produced on the substrate via the lithography are nanoscale between 1 nm-10 μm in a least one dimension.

28. The method of claim 17, wherein the layer of conductive material is deposited at at least two corners of the probe array or the substrate along with four regions in the center-side regions.

29. The method of claim 28, wherein the layer of conductive material is between 5 nm and 5 μm.

30. The method of claim 28, wherein the conductive material includes one of Au, Al, Ag, Pt, Ti, or Cr.

31. The method of claim 28, wherein application of voltage to the four corner regions and connecting the four center-side regions to ground, or vice versa, configures four independent electric circuits, and wherein measurement of electrical current in each of the four electric circuits is indicative of relative positioning of the probe array and the substrate.

32. A method of manufacturing a plurality of components on a substrate using lithography, the method comprising:
   providing a probe array;
   positioning the probe array or a substrate relative to each another, wherein a plurality of components are to be manufactured on the substrate by lithography; and
   aligning the probe array or the substrate parallel to each other on an automated basis based on measured electrical current; and
   performing lithography using the probe array to produce uniform feature sizes on the substrate,
   wherein alignment of the probe array or the substrate to be parallel to each other is performed in multiple orthogonal planes to level the probe array or substrate relative to one another,
      wherein a layer of conductive material is deposited at at least two regions of the probe array and at least one region of the substrate, or vice versa, to form conductive regions,
      wherein application of voltage to the conductive regions on the probe array, substrate or both configures multiple independent electrical circuits between the probe array and the substrate, and
   wherein measurement of electrical current in each of the independent electrical circuits is indicative of relative positioning of the probe array and the substrate.

33. The method of manufacturing of claim 32, wherein the automated alignment applies a voltage bias to either or both of the probe array and the substrate to induce a measurable electrical current to indicate electrical contact between a conductive region of the substrate and a corresponding conductive region of the probe array.

34. The method of manufacturing of claim 32, wherein the automated alignment forms an electric circuit capable of carrying electric current.

35. The method of manufacturing of claim 32, wherein the automated alignment is performed by the controller performing iterative control and movement of either the probe array or the substrate relative to each other while measuring electrical current between corresponding conductive regions of the probe array and the substrate.

36. The method of manufacturing of claim 32, wherein the automated alignment positions the probe array or the substrate such that the probe array and the substrate are positioned parallel to each other within 0.005° in less than ten minutes.

37. The method of manufacturing of claim 32, wherein the probe array is one of a cantilever-free scanning probe array, a polymer pen/probe array or a beam pen/probe array.

38. The method of manufacturing of claim 32, wherein the lithography instrument is a Polymer Pen Lithography instrument, and wherein the probe array includes a massively parallel array of probes, each of which acting as a point source for direct molecular printing.

39. The method of manufacturing of claim 32, wherein the lithography instrument is a Beam Pen Lithography instrument, and wherein the probe array includes a massively parallel array of probes used to perform diffraction-unlimited patterning with light.

40. The method of manufacturing of claim 39, wherein tips in the probe array are coated with an opaque material with apertures at apexes of the tips.

41. The method of manufacturing of claim 32, wherein the lithography is cantilever-free scanning probe lithography.

42. The method of manufacturing of claim 32, wherein features produced on the substrate via the lithography are nanoscale between 1 nm-10 μm in a least one dimension.

43. The method of manufacturing of claim 32, wherein the layer of conductive material is deposited at at least two corners of the probe array or the substrate along with four regions in the center-side regions.

44. The method of manufacturing of claim 43, wherein the layer of conductive material is between 5 nm and 5 μm.

45. The method of manufacturing of claim 43, wherein the conductive material includes one of Au, Al, Ag, Pt, Ti, or Cr.

46. The method of manufacturing of claim 43, wherein application of voltage to the four corner regions and connecting the four center-side regions to ground, or vice versa, configures four independent electric circuits, and wherein measurement of electrical current in each of the four electric circuits is indicative of relative positioning of the probe array and the substrate.

47. A lithography instrument comprising:
   a probe array;
   a controller that controls positioning of the probe array or a substrate relative to each other, wherein a plurality of components are to be manufactured on the substrate by lithography; and
   a motorized tip/tilt stage coupled to the controller and either the probe array or the substrate that enables tilting of the probe array or the substrate relative to each other in two orthogonal planes under the control of the controller,
   wherein the controller controls iterative movement of the motorized tip/tilt stage to align the probe array and the substrate in parallel on an automated basis in response to iterative measurement of electric current between a plurality of regions of the probe array and the substrate for subsequent manufacturing lithography,
      wherein a layer of conductive material is deposited at at least two regions of the probe array and at least one region of the substrate, or vice versa, to form conductive regions,
      wherein application of voltage to the conductive regions on the probe array, substrate or both configures multiple independent electrical circuits between the probe array and the substrate, and wherein measurement of electrical current in each of the independent electrical circuits is indicative of relative positioning of the probe array and the substrate.

48. The lithography instrument of claim 47, wherein the automated alignment applies a voltage bias to either the probe array or the substrate to induce a measurable electrical current to indicate electrical contact between a conductive region of the substrate and a corresponding conductive region of the probe array.

49. The lithography instrument of claim 47, wherein the automated alignment forms an electric circuit capable of carrying electric current.

50. The lithography instrument of claim 47, wherein the automated alignment is performed by the controller performing iterative control and movement of either the probe array or the substrate relative to each other while measuring electrical current between corresponding conductive regions of the probe array and the substrate.

51. The lithography instrument of claim 47, wherein the automated alignment positions the probe array or the substrate such that the probe array and the substrate are positioned parallel to each other within 0.005° in less than ten minutes.

52. The lithography instrument of claim 47, wherein the probe array is one of a cantilever-free scanning probe array, a polymer pen/probe array or a beam pen/probe array.

53. The lithography instrument of claim 47, wherein the lithography instrument is a Polymer Pen Lithography instrument, and wherein the probe array includes a massively parallel array of probes, each of which acting as a point source for direct molecular printing.

54. The lithography instrument of claim 47, wherein the lithography instrument is a Beam Pen Lithography instrument, and wherein the probe array includes a massively parallel array of probes used to perform diffraction-unlimited patterning with light.

55. The lithography instrument of claim 54, wherein tips in the probe array are coated with an opaque material with apertures at apexes of the tips.

56. The lithography instrument of claim 47, wherein the lithography is cantilever-free scanning probe lithography.

57. The lithography instrument of claim 47, wherein features produced on the substrate via the lithography are nanoscale between 1 nm-10 µm in a least one dimension.

58. The lithography instrument of claim 47, wherein the layer of conductive material is deposited at at least two corners of the probe array or the substrate along with four regions in the center-side regions.

59. The lithography instrument of claim 58, wherein the layer of conductive material is between 5 nm and 5 µm.

60. The lithography instrument of claim 58, wherein the conductive material includes one of Au, Al, Ag, Pt, Ti, or Cr.

61. The lithography instrument of claim 58, wherein application of voltage to the four corner regions and connecting the four center-side regions to ground, or vice versa, configures four independent electric circuits, and wherein measurement of electrical current in each of the four electric circuits is indicative of relative positioning of the probe array and the substrate.

* * * * *